United States Patent [19]

Ikeda

[11] Patent Number: 5,431,987
[45] Date of Patent: Jul. 11, 1995

[54] NOISE FILTER

[75] Inventor: Takeshi Ikeda, Tokyo, Japan

[73] Assignee: Susumu Okamura, Tokyo, Japan; a part interest

[21] Appl. No.: 146,527

[22] Filed: Nov. 1, 1993

[30] Foreign Application Priority Data

Nov. 4, 1992 [JP] Japan .................. 4-317972

[51] Int. Cl.⁶ .................................................. B32B 9/00
[52] U.S. Cl. .................................... 428/209; 428/615; 428/620; 428/210; 428/901
[58] Field of Search ............... 428/209, 210, 901, 615, 428/620

[56] References Cited

U.S. PATENT DOCUMENTS 5,004,640 4/1991 Nakatani et al. .................. 428/209
5,079,065 1/1992 Masakazu et al. ................ 428/209
5,118,556 6/1992 Makino et al. .................... 428/209

Primary Examiner—Patrick J. Ryan
Assistant Examiner—Kam F. Lee
Attorney, Agent, or Firm—Dellett and Walters

[57] ABSTRACT

A noise filter used in a signal transmission or power supply circuit and the like for suppressing noise passing therethrough comprises a first spiral electrode formed on an insulating substrate and a second spiral electrode formed over the first spiral electrode by way of a dielectric layer. The noise filter could also include a dielectric layer formed over the first spiral electrode and the insulating substrate with the second spiral electrode formed in such a manner to partly overlap with the first spiral electrode. Preferably, a high purity semiconductor substrate having a large bulk resistance is used as the insulating substrate.

20 Claims, 5 Drawing Sheets

NOISE FILTER

BACKGROUND OF THE INVENTION

The present invention relates to a noise filter to be used in a signal transmission circuit, power supply circuit and the like in various electronic equipment for suppressing noise passing therethrough.

In digital electronic equipment such as computers, noise filters are widely used in signal transmission circuits, power supply circuits, etc.

One example of conventional noise filters comprises a pair of spiral electrodes 21,22 disposed in opposed relationship to each other by way of a dielectric member 20. Both terminals 23,24 of one spiral electrode 21 are connected for inserting the spiral electrode 21 in series in a signal transmission circuit while either one of the terminals 25 of the other spiral electrode 22 is grounded as illustrated in FIGS. 7a through 7c An equivalent circuit of the noise filter is illustrated in FIG. 8. Distributed capacitors formed between the pair of spiral electrodes 21,22 and the inductance of -the one spiral electrode 21 forming the signal transmission circuit provide a low pass filter having a sharp cut-off frequency.

In such conventional filters, ceramic, plastics, glass, mica, etc. are used as tile dielectric member 20. Spiral electrodes are formed on the opposite faces of the dielectric member 20 by the printing process.

However, as portable electronic equipment such as portable telephone, portable personal computer, etc. handling digital signals become popular, more compact noise filters are required. Unfortunately, in the conventional noise filters, there is a certain limit in increasing distributed capacitance by reducing the thickness of the dielectric member and forming longer spiral electrodes by the printing technique, thereby making it difficult to achieve significant compact noise filters.

It is therefore an object of the present invention to provide noise filters suited for quantity production, significantly compact design and laving excellent noise suppressing performance.

SUMMARY OF THE INVENTION

The noise filter according to the present invention comprises a first spiral electrode formed on an insulating substrate and a second spiral electrode formed over the first spiral electrode by way of a dielectric layer.

Also, the noise filter according to the present invention comprises a first spiral electrode formed on an insulating substrate, a dielectric layer formed over the first spiral electrode and tile insulating substrate and a second spiral electrode formed in such a manner to partly overlap with the first spiral electrode. Preferably, a high purity semiconductor substrate having a large bulk resistance is used as the insulating substrate.

BRIEF DESCRIPTION OF DRAWINGS

FIG. 2 FIG. 2a illustrates a plan view of the noise filter made in the steps of FIG. 1.

FIGS. 7a—7c illustrate views of one example of the conventional noise filters wherein FIG. 7a is a front view, FIG. 7b is a side view and FIG. 7c is a rear view.

EMBODIMENTS

(First Embodiment)

Figure 1:
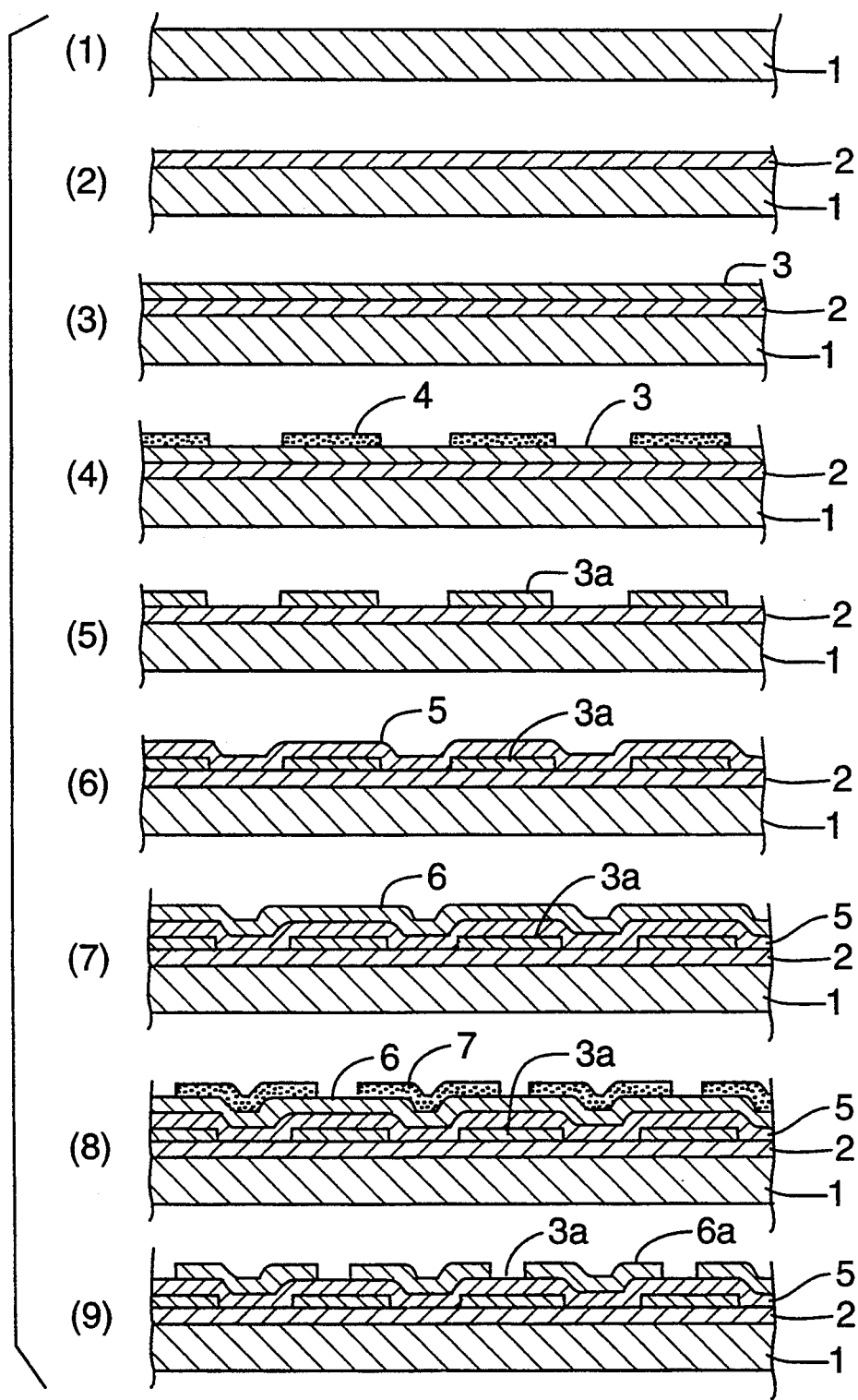
FIG. 1 illustrates in cross section views the steps of making one embodiment of the noise filter according to the present invention.

A first embodiment of tile noise filter according to the present invention will be described in accordance with the process of making such a noise filter as illustrated in cross section views in FIG. 1.

(1) Firstly, prepared is an insulating substrate 1 such as glass, plastics, purity silicon wafer, etc. A high purity silicon wafer having high bulk resistance is particularly suited for the insulating substrate 1.

(2) A first silicon dioxide ($SiO_2$) film 2 is formed on one surface of the silicon wafer by chemical vapor deposition (CVD) technique.

(3) A metal film 3 such as, for example, gold, tungsten, molybdenum, tantalum, niobium, etc. to resist the subsequent CVD steps is formed on the silicon dioxide film 2 on the silicon wafer 1 by vapor deposition technique.

(4) A spiral pattern of a photoresist 4 is formed on the metal film 3 by photo lithography.

(5) The photoresist 4 is used as a mask to form a first spiral metal electrode 3a before washing off the photoresist 4.

(6) A second silicon dioxide film 5 is formed on the first spiral metal electrode 3a and the exposed silicon dioxide film 2 by CVD technique.

(7) An aluminium film 6 is vapor deposited on the second silicon dioxide film 5.

(8) A spiral pattern of a photoresist 7 wider than the gap between electrodes is formed on the aluminium film 6 along the center line between adjacent electrodes of the first spiral metal electrode 3a.

(9) A spiral aluminium electrode 6a having a terminal 6b at one end is formed using the photoresist 7 as a mask and then time photoresist 7 is washed off.

(10) The first silicon dioxide film 5 at one or both end portions of the first spiral metal electrode 3a is etched to expose the first spiral metal electrode 3a and terminals 3b, 3c are formed.

Figure 2A:
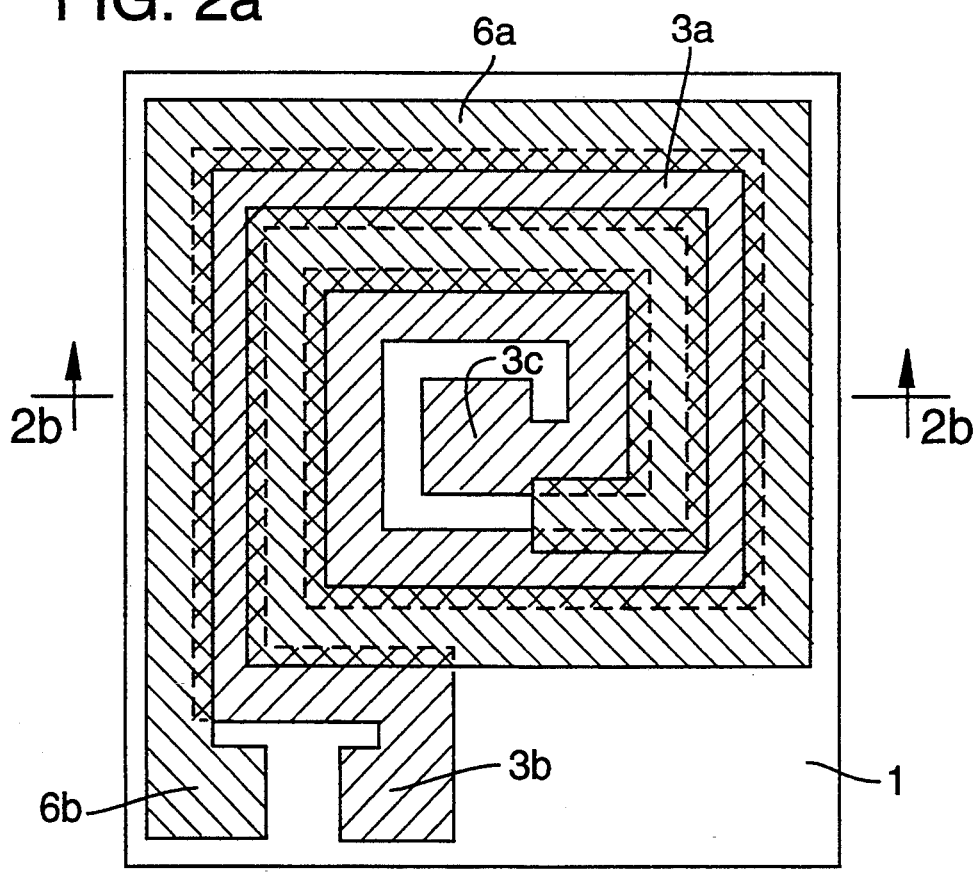
Figure 2B:
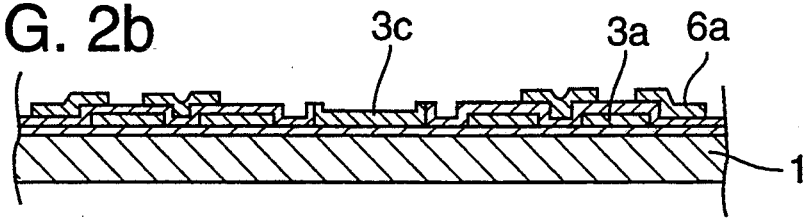
FIG. 2b illustrates a cross section view of the noise filter in FIG. 2a along line 2b—2b.
Figure 3:
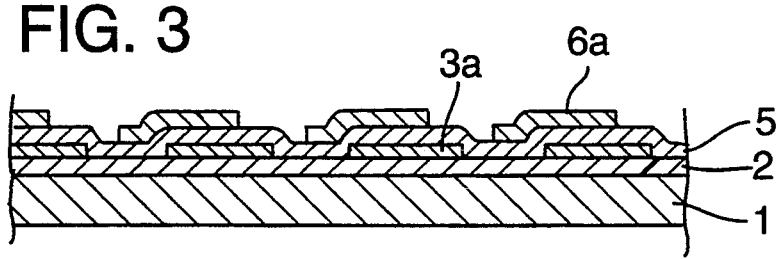
FIG. 3 illustrates a cross section view of a second embodiment of the noise filter according to the present invention.
Figure 4:
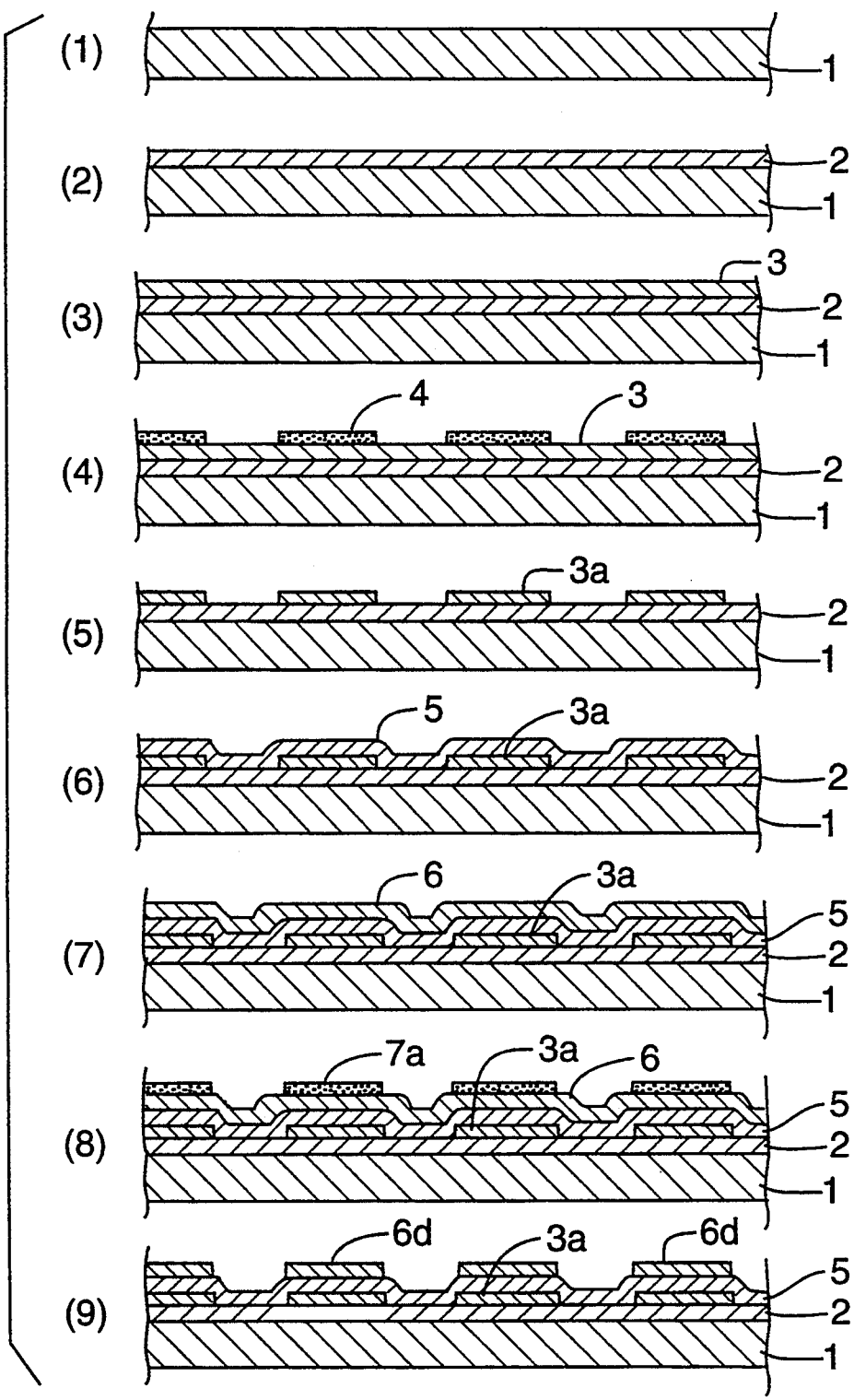
FIG. 4 illustrates in cross section views the steps of making a third embodiment of the noise filter according to the present invention.

The noise filter element made on the insulating substrate or the silicon wafer 1 by the series of the above steps (1) through (10) is illustrated in FIG. 2a in a plan view and in FIG. 2b in a cross section view along the line 2b-2b in FIG. 2a. Preferably, a plurality of spiral metal electrodes 3a, 6a are formed simultaneously at different areas on the silicon wafer 1 which is subsequently divided. The terminals 3b, 3c and 6b are bonded to the two spiral metal electrodes 3a, 6a before packaging.

(Second Embodiment)

Although the second spiral metal electrode 6a is formed in overlapped relation to the first spiral metal electrode 3a along both side edges in the above described first embodiment, it is to be understood that the second spiral metal electrode 6a overlaps the first spiral metal electrode 3a along one side edge of the second spiral metal electrode 6a. In other words, it is only required that tile first and the second spiral metal electrodes 3a, 6a partly overlap along the length for electrical coupling therebetween.

(Third Embodiment)

Now, described hereunder are steps of making a third embodiment of the noise filter according to the present invention. The steps (1) through (7) are identical to the corresponding steps in the first embodiment described hereinbefore.

(1) Firstly, is an insulating substrate such as a parity silicon wafer 1, etc. is prepared (2) A first silicon dioxide film 2 is formed on the silicon wafer 1 by CVD technique.

(3) A metal film 3 resisting subsequent CVD process is formed on the silicon dioxide film 2 on the silicon wafer 1 by vapor deposition.

(4) A spiral pattern of a photoresist 4 is formed on the metal film 3 by photo lithography.

(5) A first spiral metal electrode 3a is formed using the photoresist 4 as a mask and then the photo-resist 4 is washed off.

(6) A second silicon dioxide film 5 is formed by CVD technique on the first spiral metal electrode 3a and the exposed first silicon dioxide film 2.

(7) An aluminium film 6 is vapor deposited on the second silicon dioxide film 5.

(8) A spiral pattern of a photoresist 7a is formed on the aluminium film 6 at the location corresponding to the first spiral metal electrode 3a.

(9) A second spiral aluminium electrode 6d having a terminal at one end is formed using the photoresist 7a as a mask. Subsequently, the photoresist 7a is washed off.

(10) The first silicon dioxide film 5 at one or both ends of the first spiral metal electrode 3a is etched to expose a part of the first spiral metal electrode 3a where a terminal is formed.

The silicon wafer 1 preferably has a plurality of spiral metal electrodes 3a, 6a which are divided and packaged after bonding the terminals to the two spiral metal electrodes 3a, 6a.

Figure 5:
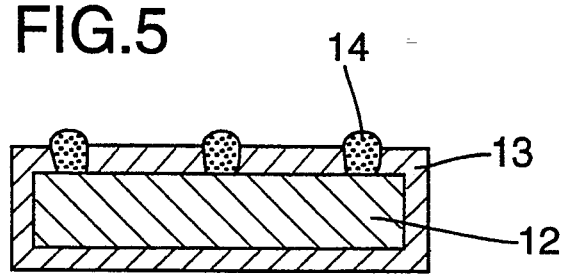
FIG. 5 illustrates a cross section view of the packaged noise filter made by the steps of the first through third embodiments.

Now, packaging the noise filter made by the steps in the above first, second or third embodiment is described by reference to FIG. 5. The divided silicon wafer chip 12 is coated with a silicon dioxide film 13 on the entire surface by CVD technique. Holes are bored in the silicon dioxide film 13 by etching at the locations where the terminals are formed. The holes are filled with a solder 14 to extend from the outer surface of the silicon dioxide film 13. The solder bumps 14 can be contacted directly to lands on a printed circuit board. This is particularly suited for surface mounting (SMT). It is appreciated that plastics or other insulating materials can be used for surface protection of the chip 12 and that a laser beam can be used to bore holes in the protection film.

(Fourth Embodiment)

Now, a fourth embodiment of the present invention is described for fabricating a noise filter in a 3 dimension al manner on the surface of a silicon wafer where integrated circuits have been fabricated.

Figure 6:
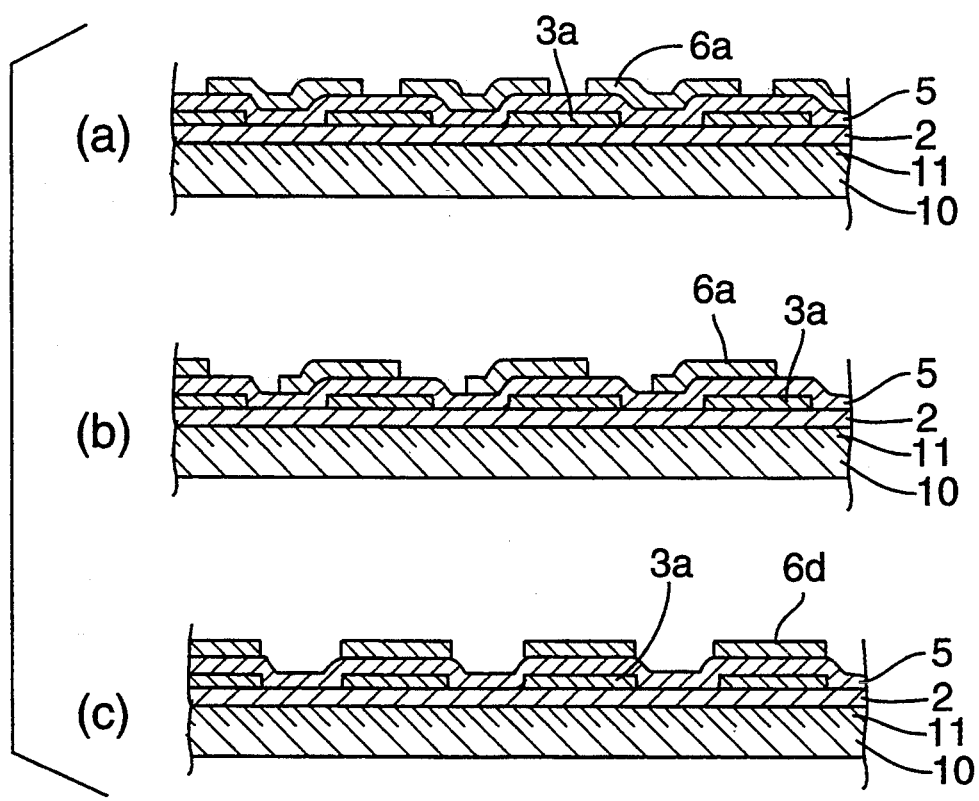
FIG. 6 illustrates a cross section view of a fourth embodiment of the noise filter according to the present invention.
Figure 7A:
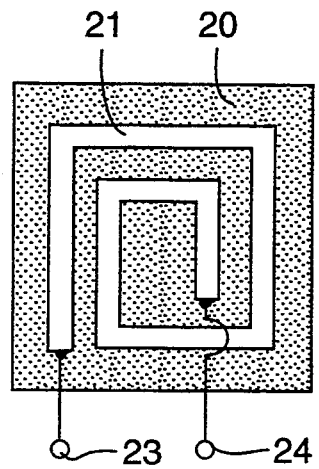
Figure 7B:
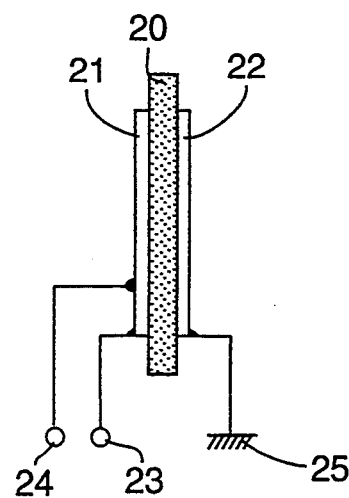
Figure 7C:
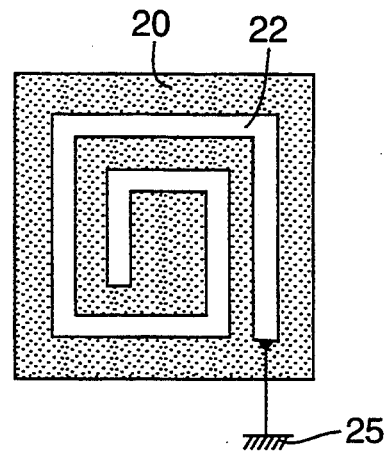
Figure 8:
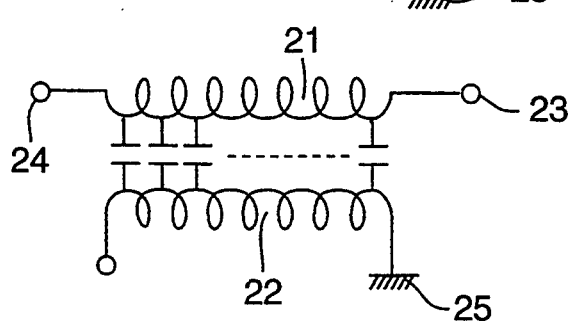
FIG. 8 illustrates an equivalent circuit of the conventional noise filter.

As illustrated in FIG. 6(a), (b) and (c) in cross section views, a silicon dioxide film 2 is formed by CVD technique on the surface of a silicon wafer 10 on which integrated circuits 11 have been fabricated. A noise filter (or noise filters) is formed on the silicon dioxide film 2 in accordance with the steps as described above with respect to the first through third embodiments.

It is appreciated that the 3 dimensional fabrication of the noise filter achieves effective use of the limited and expensive real estate on the silicon wafer.

In operating the noise filter made in accordance with either one of the above first through fourth embodiments in a normal mode, the terminal of the first spiral metal electrode of a pair of spiral metal electrodes is connected to a source of reference potential, e.g., ground while both terminals of the second spiral metal electrode are connected in series with a signal transmission circuit. Since the second spiral metal electrode is AC coupled to ground through the first spiral metal electrode, it forms a distributed circuit to prevent transmission of high frequency noise.

On the other hand, in case of operating the noise filter in a common mode, both spiral metal electrodes are inserted in series with the signal transmission circuit.

The spiral metal electrodes 3a, 6a, 6d have certain resistances depending on their film thickness and width. Thus, the quality factor (Q) of the distributed circuit can be adjusted by choosing the film thickness and/or width.

If the noise filter has high Q, there is a sharp attenuation at a particular frequency. If Q is low, a relatively flat attenuation curve is obtained over a wide frequency range. As a result, the bulk resistance of the silicon wafer that is serving as the insulating substrate, the length, thickness and width of the spiral metal electrodes and the thickness of the silicon dioxide film that s used as the dielectric film can be chosen to obtain a desired attenuation characteristic for the noise filter.

Also, in the case where the capacitance between the two spiral metal electrodes is too large and/or the inductance of one spiral metal electrode is too small, one spiral metal electrode can be chosen to be longer than the other.

(Other Embodiments)

In the above embodiments, there are formed two spiral metal electrodes 3a, 6a or 3a, 6d on a single layer. However, it is appreciated that the spiral metal electrodes may be formed on a plurality of films and interconnected between the layers in order to increase inductance and/or capacitance.

In the case of increasing the inductance of the spiral metal electrodes, a magnetic insulating material such as ferrite can be used as the insulating substrate.

The noise filter according to the present invention can be used as a discrete part by packaging one element in a case. It is also possible that the noise filter can be fabricated as a part of other circuits on a printed circuit board or an IC card to be used in connection with a power supply circuit and a signal transmission circuit.

Also, a plurality of noise filters can be formed on a common insulating substrate and packaged in a single case as an integral discrete part for preventing noise in signal transmission circuits for plural bits.

In order to protect electrostatic breakdown of the dielectric layer between the two spiral metal electrodes, a spark gap, a plurality of series connected diodes, or a zenner diode can be connected between the two spiral metal electrodes.

The dielectric layer between the two spiral metal electrodes may be a silicon nitride ($Si_3N_4$) film rather than the silicon dioxide film.

A purity semiconductor substrate such as a silicon wafer has significantly high bulk resistance as compared with the metal conductor of the spiral metal electrodes 3a, 6a, 6d and thus is conveniently used as the insulating substrate.

If the noise filter of the present invention is fabricated on a silicon wafer as the insulating substrate, the noise filter can be fabricated, inspected and packaged using the existing conventional facilities for fabricating integrated circuits, therby eliminating the need for new facilities.

As is apparent from the above descriptions of various embodiments of the present invention, the noise filter according to the present invention is very compact, less expensive to make and suited for quantity production using the conventional and established processes for fabricating IC devices without the need for new facilities. Also, noise filter elements having various attenuation characteristics can be obtained easily.

What is claimed is:

1. A noise filter characterized in that a first spiral electrode is formed on an insulating substrate and a second spiral electrode is formed on said first spiral electrode by way of dielectric layer.

2. A noise filter characterized in that a first spiral electrode is formed on an insulating substrate, a dielectric layer is formed on said first spiral electrode and said insulating substrate, and a second spiral electrode is formed on said dielectric layer at least partly overlapping with said first spiral electrode.

3. A noise filter according to claim 1 characterized in that at least one end of one of said spiral electrode is grounded and both ends of the other spiral electrode are connected in series with a signal transmission circuit to operate in a normal mode.

4. A noise filter according to claim 2 characterized in that at least one end of one of said spiral electrode is grounded and both ends of the other spiral electrode are connected in series with a signal transmission circuit to operate in a normal mode.

5. A noise filter according to claim 1 characterized in that both ends of said both spiral electrodes are connected in series with a signal transmission circuit to operate in a common mode.

6. A noise filter according to claim 2 characterized in that both ends of said both spiral electrodes are connected in series with a signal transmission circuit to operate in a common mode.

7. A noise filter according to claim 1 characterized in that a high purity semiconductor substrate is used as said insulating substrate.

8. A noise filter according to claim 2 characterized in that a high purity semiconductor substrate is used as said insulating substrate.

9. A noise filter according to claim 3 characterized in that a high purity semiconductor substrate is used as said insulating substrate.

10. A noise filter according to claim 4 characterized in that a high purity semiconductor substrate is used as said insulating substrate.

11. A noise filter according to claim 1 characterized in that a magnetic insulating substrate is used as said insulating substrate.

12. A noise filter according to claim 2 characterized in that a magnetic insulating substrate is used as said insulating substrate.

13. A noise filter according to claim 3 characterized in that a magnetic insulating substrate is used as said insulating substrate.

14. A noise filter according to claim 4 characterized in that a magnetic insulating substrate is used as said insulating substrate.

15. A noise filter according to claim 1 characterized in that a plurality of noise filters are formed as an integral part on an insulating substrate.

16. A noise filter according to claim 2 characterized in that a plurality of noise filters are formed as an integral part on an insulating substrate.

17. A noise filter according to claim 3 characterized in that a plurality of noise filters are formed as an integral part on an insulating substrate.

18. A noise filter according to claim 4 characterized in that a plurality of noise filters are formed as an integral part on an insulating substrate.

19. A noise filter according to claim 1 fabricated on said substrate which also includes fabricated IC circuits.

20. A noise filter according to claim 2 fabricated on said substrate which also includes fabricated IC circuits.

* * * * *